(12) United States Patent
Nobunaga et al.

(10) Patent No.: US 7,480,195 B2
(45) Date of Patent: Jan. 20, 2009

(54) INTERNAL DATA COMPARISON FOR MEMORY TESTING

(75) Inventors: Dean Nobunaga, Cupertino, CA (US); Ebrahim Abedifard, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 174 days.

(21) Appl. No.: 11/126,747

(22) Filed: May 11, 2005

(65) Prior Publication Data

US 2006/0256631 A1 Nov. 16, 2006

(51) Int. Cl.
*G11C 7/00* (2006.01)
*G11C 29/00* (2006.01)
(52) U.S. Cl. ...................................... 365/201
(58) Field of Classification Search ................. 365/201, 365/189.05, 189.07, 190; 714/710
See application file for complete search history.

(56) References Cited

U.S. PATENT DOCUMENTS 5,077,689 A * 12/1991 Ahn ........................... 365/201
5,541,879 A 7/1996 Suh et al.
5,675,540 A 10/1997 Roohparvar
5,825,782 A 10/1998 Roohparvar
6,032,274 A 2/2000 Manning
6,519,719 B1 2/2003 Manning
6,985,395 B2 * 1/2006 Yoshimatsu et al. ......... 365/210
2004/0136248 A1 * 7/2004 Kozuka ...................... 365/201

* cited by examiner

*Primary Examiner*—Tuan T Nguyen
*Assistant Examiner*—Douglas King
(74) *Attorney, Agent, or Firm*—Leffert Jay & Polglaze, P.A.

(57) ABSTRACT

Memory devices having a normal mode of operation and a test mode of operation are useful in quality programs. The test mode of operation includes a data comparison test mode. The data comparison test mode systematically searches for addresses of defective columns by comparing a sensed data value to an expected data value at various levels of decoding. Upon detection of a defective column, the address value for each level of decoding is stored and can be used in redundancy selection to replace the defective columns with redundant columns. The comparison is internal to the memory device such that the test mode is independent of external testers and can be run after fabrication, even by an end user, thus allowing repair after fabrication and installation. The comparisons are facilitated by compare logic inserted into the data path.

31 Claims, 7 Drawing Sheets

INTERNAL DATA COMPARISON FOR MEMORY TESTING

TECHNICAL FIELD OF THE INVENTION

The present invention relates generally to semiconductor memory devices, and in particular, the present invention relates to test methods for semiconductor memory devices as well as circuits and apparatus for implementing such methods.

BACKGROUND OF THE INVENTION

Electronic information handling or computer systems, whether large machines, microcomputers or small and simple digital processing devices, require memory for storing data and program instructions. Various memory systems have been developed over the years to address the evolving needs of information handling systems. One such memory system includes semiconductor memory devices.

Semiconductor memory devices are rapidly-accessible memory devices. In a semiconductor memory device, the time required for storing and retrieving information generally is independent of the physical location of the information within the memory device. Semiconductor memory devices typically store information in a large array of cells.

Computer, communication and industrial applications are driving the demand for memory devices in a variety of electronic systems. One important form of semiconductor memory device includes a non-volatile memory made up of floating-gate memory cells called flash memory. Flash memory is often used where regular access to the data stored in the memory device is desired, but where such data is seldom changed. Computer applications use flash memory to store BIOS firmware. Peripheral devices such as printers store fonts and forms on flash memory. Digital cellular and wireless applications consume large quantities of flash memory and are continually pushing for lower voltages and higher densities. Portable applications such as digital cameras, audio recorders, personal digital assistants (PDAs) and test equipment also use flash memory as a medium to store data.

Another important form of semiconductor memory device includes a volatile memory called dynamic random access memory (DRAM). DRAM is often used where rapid access to the memory array is desired for both data input and data output. DRAM has faster access times than flash memory, but requires periodic refresh to avoid losing its data values. Computer applications typically use DRAM to store program instructions and other temporary data.

Prior to shipping, a manufacturer may test its semiconductor memory devices as part of a quality program to improve end-use reliability. It is generally common to test the devices for defective columns or rows of memory cells, and to replace those defective elements with redundant elements. By writing a known pattern to a memory array, reading data values from the array and comparing those data values to the expected data values, defective elements can be identified. Such testing is generally performed by specialized external tester devices during the fabrication process and often prior to packaging the devices. Post-packaging failures are typically impracticable to detect as the specialized tester devices are generally unavailable.

For the reasons stated above, and for other reasons stated below that will become apparent to those skilled in the art upon reading and understanding the present specification, there is a need in the art for alternative methods of testing memory devices, circuits for implementing such test methods, and memory devices making use of such circuits and test methods.

SUMMARY OF THE INVENTION

The above-mentioned problems with memory devices and other problems are addressed by the present invention and will be understood by reading and studying the following specification.

Testing of memory devices is generally performed as part of a quality program to improve end-use reliability. The memory devices described herein are capable of a normal mode of operation and a test mode of operation. The test mode of operation includes a data comparison test mode wherein data values representative of data for one or more columns of an array are compared internally to expected data values. By performing the data comparison internal to the memory device at various levels of data compression, identification of any failures may be systematically performed independent of any external testing device. Furthermore, by performing the data comparison within the data path in conjunction with the decoding circuitry, failures may be identified in significantly fewer comparisons than if each column address were to be tested individually. Internal data comparison is facilitated by introducing comparison logic into the data I/O path.

For one embodiment, the invention provides a method of testing a memory device. The method includes loading data values into an array of memory cells of the memory device, reading data values for a plurality of columns of the array, loading data values into a plurality output latches corresponding to expected data values for the plurality of columns and comparing the data values read from the array with their expected data values, wherein the comparison is performed in the data path between the array and the output latches. For repair solutions, the method may further include storing column addresses corresponding to columns where a mismatch is detected and directing access requests to the stored column addresses to redundant columns.

For another embodiment, the invention provides a memory device. The memory device includes an array of memory cells arranged in rows and columns, row access circuitry for accessing rows of the array and column access circuitry for accessing columns of the array. The column access circuitry includes compare circuits coupled to data paths between sensing devices and output latches of the memory device for selectively comparing logic levels presented to the data paths by the sensing devices to logic levels presented to the data paths by the output latches.

The invention further provides methods and apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The following detailed description is, therefore, not to be taken in a limiting sense, and the scope of the present invention is defined only by the appended claims and equivalents thereof.

Although the testing methods and data comparison circuits described herein are applicable to a variety of memory device types, including various forms of volatile and non-volatile memory devices known in the art, such methods and comparison circuits will be described in relation to a flash memory device. Those skilled in the art will readily recognize their applicability to other memory devices.

Figure 1:
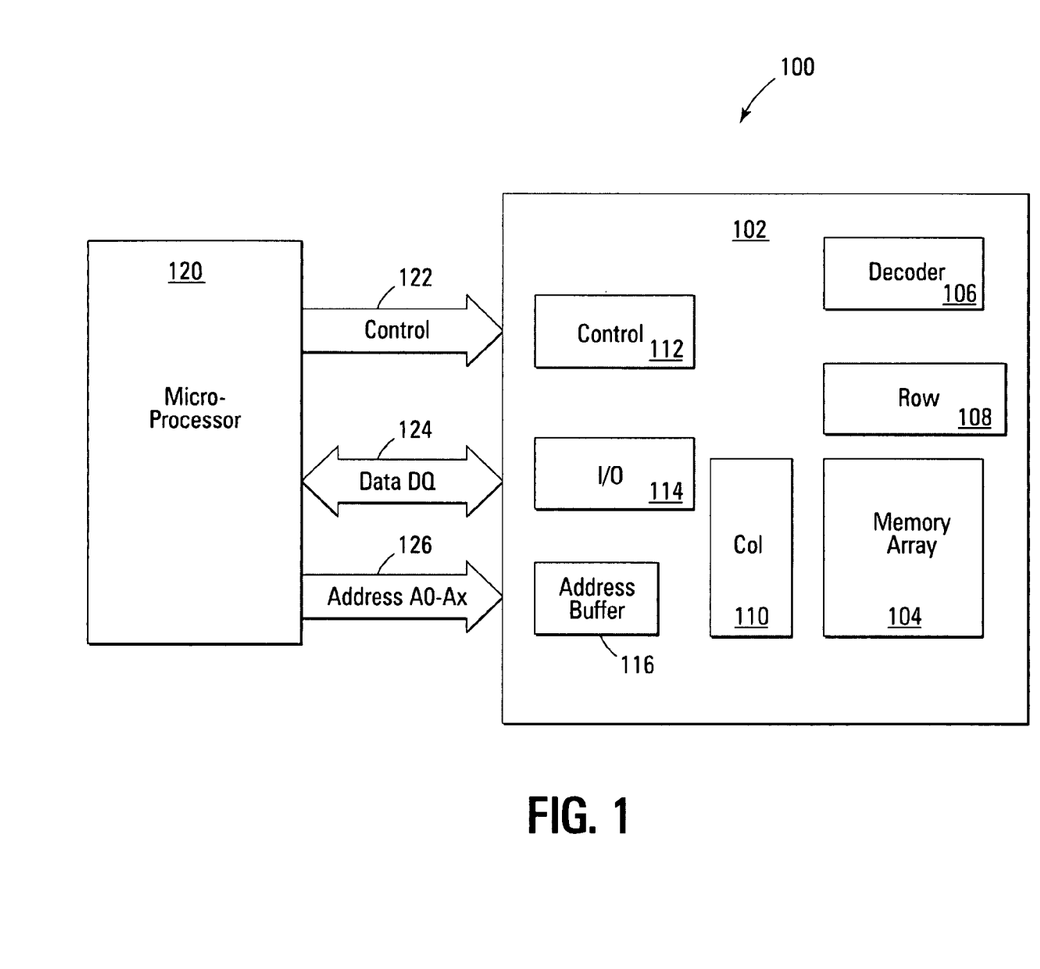
FIG. 1 is a simplified block diagram of a memory system, according to an embodiment of the invention.

FIG. 1 is a simplified block diagram of a memory system 100, according to an embodiment of the invention. Memory system 100 includes an integrated circuit flash memory device 102, e.g., a NAND memory device, that includes an array of memory cells 104, an address decoder 106, row access circuitry 108, column access circuitry 1 10, control circuitry 112, Input/Output (I/O) circuitry 114, and an address buffer 116. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. The control circuitry 112 is adapted to perform test methods in accordance with embodiments of the invention. Furthermore, column access circuitry 110 includes data comparison logic in accordance with embodiments of the invention. It will be appreciated by those skilled in the art that additional circuitry and control signals can be provided, and that the memory device of FIG. 1 has been simplified to help focus on the invention.

Figure 2:
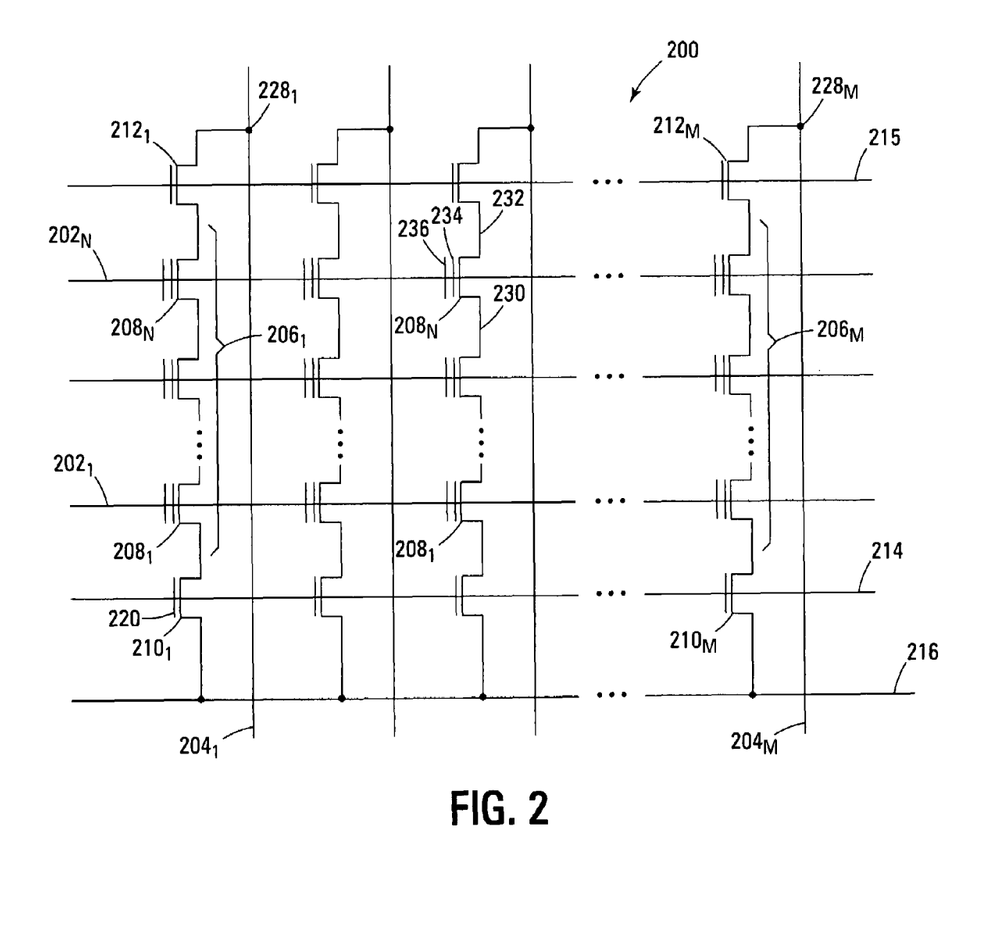
FIG. 2 is a schematic of a NAND memory array, according to another embodiment of the invention.

FIG. 2 is a schematic of a NAND memory array 200 as a portion of memory array 104 in accordance with another embodiment of the invention. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are each some power of two, e.g., 256 word lines 202 by 4,096 bit lines 204.

Memory array 200 includes NAND strings $206_1$ to $206_M$. Each NAND string includes floating-gate transistors $208_1$ to $208_N$, each located at an intersection of a word line 202 and a bit line 204. The floating-gate transistors 208 represent non-volatile memory cells for storage of data. The floating-gate transistors 208 of each NAND string 206 are connected in series source to drain between a source select line 214 and a drain select line 215. Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the floating-gate transistors 208 of each NAND string 206 are connected between a source select gate 210 and a drain select gate 212.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. Each source select gate 210 includes a control gate 220.

The drain of each drain select gate 212 is connected to the bit line 204 for the corresponding NAND string at a drain contact 228. For example, the drain of drain select gate $212_1$ is connected to the bit line $204_1$ for the corresponding NAND string $206_1$ at drain contact $228_1$. The source of each drain select gate 212 is connected to the drain of the last floating-gate transistor $208_N$ of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of memory array 200 includes a NAND string 206 and the source and drain select gates connected thereto. A row of the floating-gate transistors 208 are those transistors commonly coupled to a given word line 202.

Figure 3:
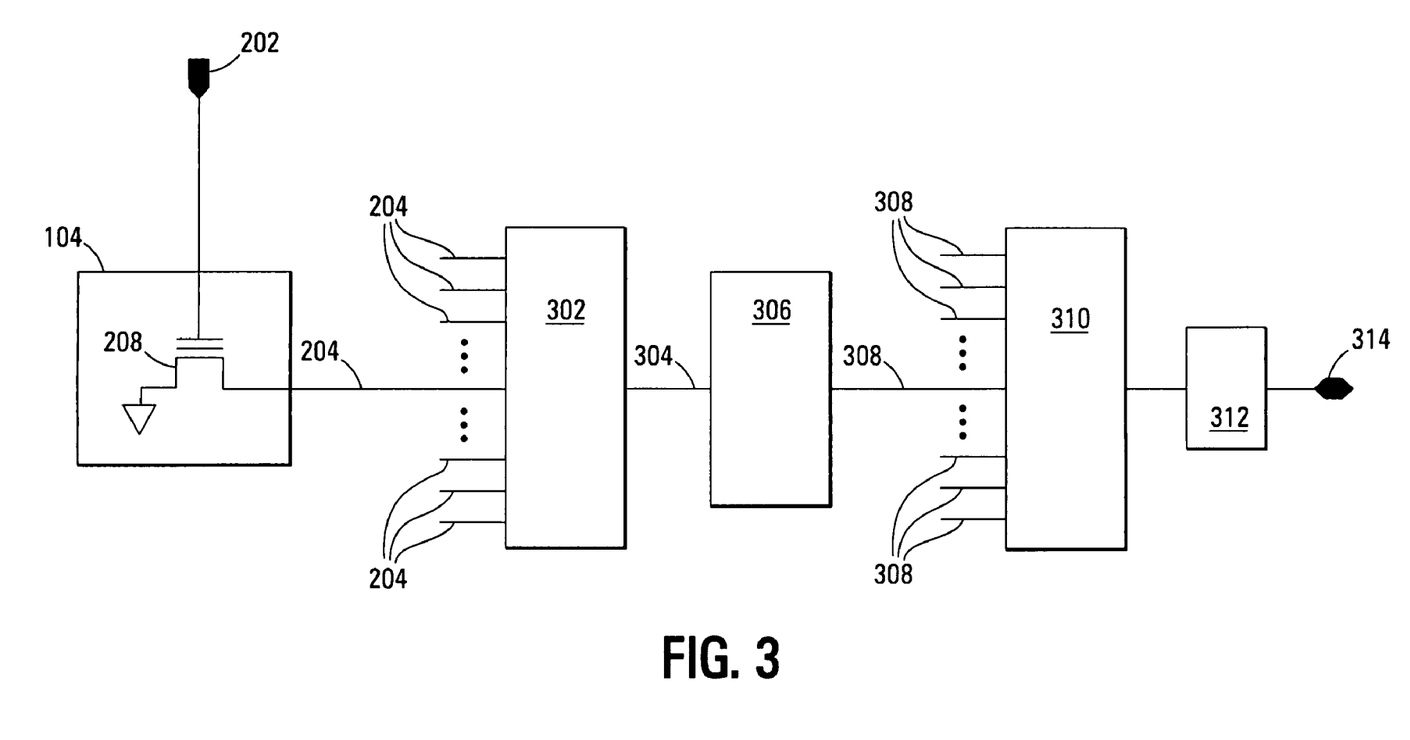
FIG. 3 is a schematic of a data path proceeding from the memory array through the column access circuitry to the I/O circuitry in accordance with an embodiment the invention.

FIG. 3 is a schematic of a data path proceeding from the memory array through the column access circuitry to the I/O circuitry in accordance with an embodiment the invention. Because memory devices typically contain millions, if not billions, of memory cells, it is common to have multiple levels of multiplexing in coupling a memory cell to a DQ line of the memory device.

As shown in FIG. 3, a target memory cell 208 as part of a memory array 200 selectively coupled to a first multiplexer 302 through its associated bit line 204, along with bit lines 204 from a number of other memory cells (not shown in FIG. 3). As one example, for a memory array 200 of the type depicted in FIG. 2, a target memory cell 208 might be selectively coupled to the first multiplexer 302 upon activation of its word line 202 and an associated drain select gate (not shown in FIG. 3). The first multiplexer 302 may be configured to select one of every two or more bit lines in response to an address decoder (not shown in FIG. 3) and couple it to an output 304. It will be apparent that other memory array configurations, such as NOR configurations, are also suitable for use with the invention.

The output 304 is provided to sensing and latching circuitry 306. The sensing and latching circuitry 306 senses the data value of the target memory cell 208 and provides a signal indicative of its data value on its output 308. The output 308 of sensing and latching circuitry 306 is then provided to column decode circuitry 310 along with other outputs 308 from other sensing devices (not shown in FIG. 3). The column decode circuitry 310 is configured to select one of a plurality of outputs 308 in response to an address decoder (not shown in FIG. 3) and couple it to an output latch 312 to place the data signal on the node 314, such as a DQ line, of the memory device. Note that the data path is generally bi-directional, and the output latch 312 generally also receives data values from the node 314 during a write operation to the memory device. Often, the data path includes two data signal legs, i.e., for carrying complementary logic levels. The column decode circuitry 310 includes comparison circuitry in accordance with an embodiment of the invention.

Figure 4:
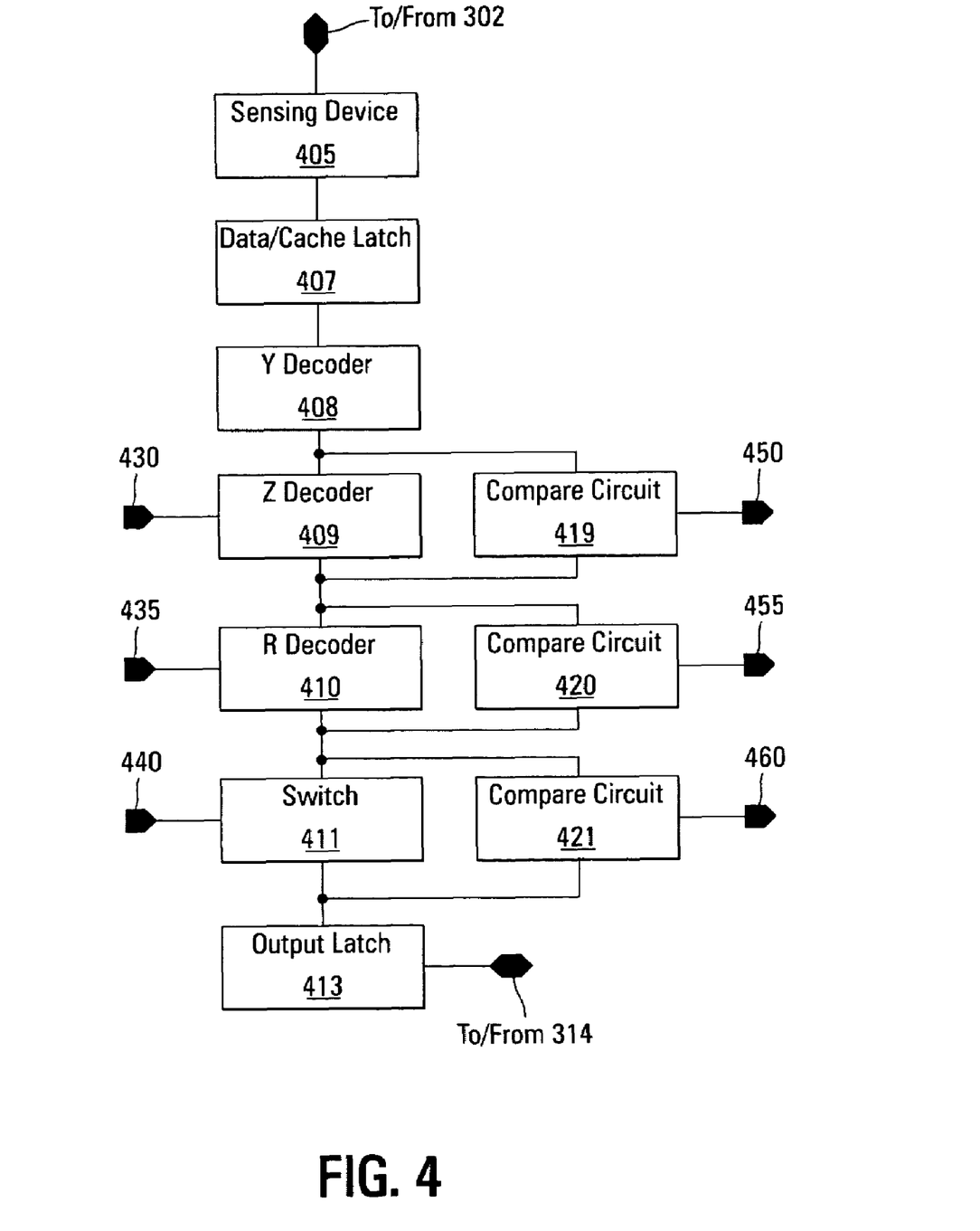
FIG. 4 is a schematic of a data path proceeding from the memory array through the column access circuitry to the I/O circuitry in accordance with a further embodiment the invention.

FIG. 4 is a schematic of a data path proceeding from the memory array through the column access circuitry to the I/O circuitry in accordance with a further embodiment the invention. A sensing device 405 senses a data value from a target memory cell (not shown in FIG. 4). The sensing device 405 then passes the data value to one or more latches, such as a data latch and/or cache latch 407. Two latches are typically used in a flash memory device. In such configurations, the cache latch can hold data for passing to the output latch while the sensing device senses a data value from a subsequent memory cell for latching in a data latch. However, the various embodiments are not dependent upon a specific number of latches.

As noted previously, multiple levels of multiplexing may be used to determine whether a sensed data value is coupled to the output latch 413 in normal operation. For the embodiment depicted in FIG. 4, three levels of multiplexing, or decoding, are involved. These levels of decoding include a first level of decoding, such as provided by Y decoder 408, a second level of decoding, such as Z decoder 409, and a third level of decoding, such as R decoder 410, provide levels of selection, or predecoding. Although the first level of decoding for this embodiment is shown to occur between the sensing devices and the output latches 413, the first level of decoding for comparison of data could occur prior to the sensing devices, such as the multiplexer 302 of FIG. 3. The decoders 408, 409 and 410 are essentially switches that selectively couple or isolate the data path from the output latch 413 in response to control signals, and may be referred to herein generally as switches. The data path further includes a switch 411, whose use will be described later. Output latch 413 is coupled to an I/O node 314 of the memory device.

In practice, a first level of decoding downstream from the sensing devices selects a first subset of columns for coupling to the output latches 413. Additional levels of decoding select further subsets of the first subset of sensed data values for coupling to the output latches 413. As an example, in normal operation, a first decoder might be responsive to 4 bits of the column address and select 1 of every 16 columns for sensing. A second decoder might be responsive to 3 bits of the column address and select 1 of every 8 data values for coupling to the output latch 413. And a third decoder might be responsive to 3 bits of the column address and select 1 of every 8 data values selected by the second decoder for coupling.

Switches 409, 410 and 411 are each associated with a compare circuit 419, 420 and 421, respectively. In each data path, there is a compare circuit for each level of decoding, with a compare circuit for a given level of decoding placed between its respective decoder and the output latches. The compare circuits 419, 420 and 421 each have a first input on one side of its associated switch and a second input on the other side of its associated switch. The compare circuits 419, 420 and 421 generate an output signal on their outputs 450, 455 and 460, respectively, indicative of whether their first and second inputs are receiving the same data value. As an example, compare circuits 419, 420 and 421 could include logic, such as XOR or XNOR, that output a first logic level if each input is the same and a second logic level if the inputs have complementary logic levels.

Figure 5:
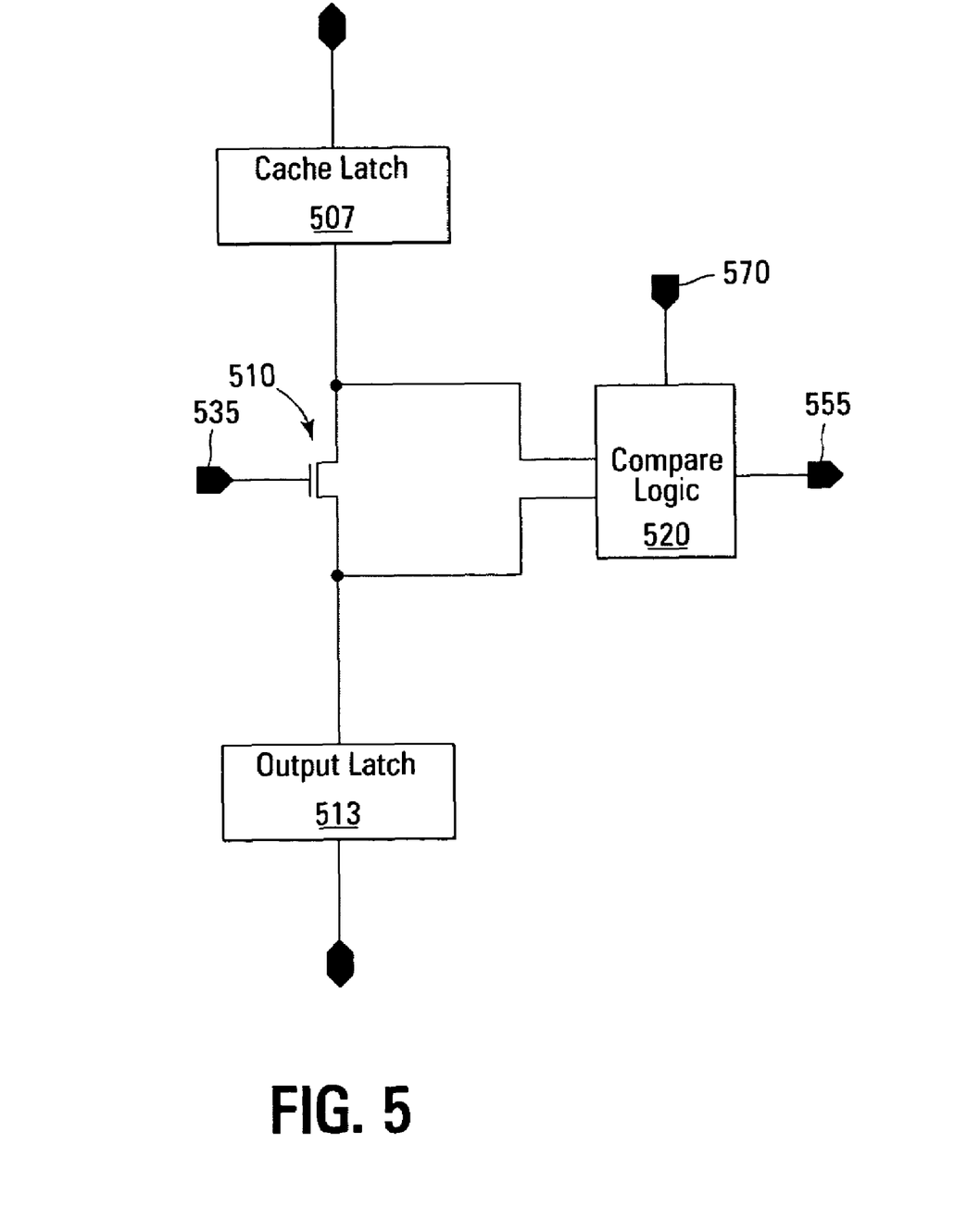
FIG. 5 is a schematic of a portion of a data path in accordance with a still further embodiment the invention showing one example of the relationship between decoding circuitry and a compare circuit.

FIG. 5 is a schematic of a portion of a data path in accordance with a still further embodiment the invention showing one example of the relationship between decoding circuitry and a compare circuit. In FIG. 5, a cache latch 507 and an output latch 513 are on opposing sides of a switch, e.g., n-type field effect transistor (nFET) 510. The nFET 510 may be part of a decode circuit for selectively coupling the cache latch 507 to the output latch 513 in response to a control signal at node 535. Compare circuit 520 has a first input coupled to a first source/drain region of the nFET 510 and a second input coupled to a second source/drain region of the nFET 510. Compare circuit 520 is further shown to receive an enable signal from node 570; during normal operation, there is no need for the compare circuit 520. By loading a data value in the cache latch 507 and an expected data value in the output latch 513, while the cache latch 507 and output latch 513 are isolated from each other, e.g., by deactivating the NFET 510, compare circuit 520 may compare their respective values, if enabled, and output a signal indicative of a match or mismatch at node 555. Note, however, that compare circuit 520 will not compare a data value selected by nFET 510, but a data value selected by a higher level of decoding. For example, if nFET 510 is a part of the Z decoder 409 of FIG. 4, compare circuit 520 would compare a data value selected by the Y decoder 408 of FIG. 4.

To locate a defective column of a memory device, a series of data comparisons are made within the memory device. This discussion will refer back to FIG. 4. A known pattern is first written to the memory array. The input pattern is preferably a repeating pattern, with each word of the input page having the same pattern. For example, for a page containing two 8-bit words, the pattern may be all zeros "0000000000000000," all ones "1111111111111111", checkerboard "0101010101010101" or reverse checkerboard "1010101010101010." In general terms, in a repeating pattern for a page having two or more words, every bit of a first word has the same data value as its corresponding bit of each remaining word such that each word has the same data pattern. Stated alternatively, for a page having M words of N bits each, $bit_n = bit_{mN+n}$ for each value of m and n, where m is some integer value from 0 to M-1 and n is some integer value from 0 to N-1.

A read operation is then performed on the memory device, such that sensing device 405 senses the data value of a target memory cell and loads the sensed data value into the data/cache latch 407. In read operations, many memory cells are generally read in parallel, such that multiple data/cache latches 407 will hold data values concurrently, each representative of a different memory cell. As an example, if an address value of the multiplexer 302 of FIG. 3 selects 512 columns for sensing, data will be latched for each of the columns.

Contemporaneously, the expected data values are loaded into the output latches 413. The data/cache latches 407 should be isolated from the output latches 413 such that they each independently hold their respective data values. Loading each output latch 413 with its expected data value is made easier by utilizing a repeating pattern in the array.

Note that loading the same data value in the output latch 413 as is contained in the data/cache latches 407 may result in a complementary value appearing on the data path. For example, if a memory cell contains a data value having a first logic level, such as a logic high or 1, an output of the data/ cache latch 407 may be the first logic level. However, if a data value having the first logic level is loaded into the output latch 413 for comparing to the sensed data value, that output of the output latch 413 may be a second logic level, such as a logic low or 0. Thus, the comparison logic may need to compensate to provide an indication of a mismatch only if the logic levels of the data values differ and not merely if the logic levels on the data path differ.

After loading the sensed and expected data values into latches at both ends of the data path, a comparison of the sensed and expected data values is made at a first level of decoding using a first compare circuit. To perform the comparison at the first level of decoding, such as provided by Y decoder 408, the inputs of the first compare circuit, e.g., compare circuit 419, must be isolated from each other. In the embodiment depicted in FIG. 4, this can be accomplished by deactivating the switches of the Z decoder 409. Remaining switches in the path to the output latch 413, e.g., switches of R decoder 410 and switches 411, would be activated to allow coupling of the cache latch 407 to the Z decoder 409 and to allow coupling of the output latch 413 to the Z decoder 409. In this manner, compare circuit 419 receives the sensed data value at a first input and the expected data value at a second input. The compare circuit 419 then provides a signal at its output 450 having a first logic level if both the sensed data value and the expected data value are the same and having a second logic level if the sensed data value and the expected data value have complementary logic levels. This process can be repeated for each address value of the Y decoder, e.g., 16 cycles if the Y decoder is responsive to 4 bits of the column address. If no mismatch is indicated, each of the columns is deemed to be good.

If the compare circuit 419 indicates a mismatch between the sensed and expected data values, at least one column selected by the Y decoder 408 is deemed to be defective and the address value of the Y decoder 408 is stored for use in redundancy selection. Upon detecting a defective column at the first level of decoding, further comparisons are made at higher levels of decoding.

To perform the comparison at a second level of decoding, such as provided by Z decoder 409, the inputs of the second compare circuit, e.g., compare circuit 420, must be isolated from each other. In the embodiment depicted in FIG. 4, this can be accomplished by deactivating the switches of the R decoder 410. Remaining switches in the path to the output latch 413, e.g., switches 411, would be activated to allow coupling of the output latch 413 to the R decoder 410 and to allow coupling of the cache latch 407 to the R decoder 410 if the Z decoder 409 is set to allow coupling, i.e., its address value matches its respective portion of the column address.

In this manner, for selected columns, compare circuit 420 receives the sensed data value at a first input and the expected data value at a second input. The compare circuit 420 then provides a signal at its output 455 having a first logic level if both the sensed data value and the expected data value are the same and having a second logic level if the sensed data value and the expected data value have complementary logic levels. Note that if the column is not selected by higher levels of decoding, one input of the compare circuit 420 could be floating. For one embodiment, the compare circuits 420 do not indicate a mismatch if one input is floating, i.e., they provide their first logic level. For a further embodiment, they present a high impedance if one input is floating. The compare process can be repeated for each address value of the Z decoder, e.g., 8 cycles if the Z decoder is responsive to 3 bits of the column address.

If the compare circuit 420 indicates a mismatch between the sensed and expected data values, at least one column selected by the Z decoder 409 is deemed to be defective and the address value of the Z decoder 409 is stored for use in redundancy selection. Upon detecting a defective column at the second level of decoding, further comparisons may be made at higher levels of decoding. Note that if the second level of decoding is capable of identifying an individual column, no further comparisons would be necessary.

To perform the comparison at a third level of decoding, such as provided by R decoder 410, the inputs of the third compare circuit, e.g., compare circuit 421, must be isolated from each other. In the embodiment depicted in FIG. 4, this can be accomplished by deactivating the switches 411. Remaining switches in the path to the output latch 413, if any, would be activated to allow coupling of the output latch 413 to the switch 411 and to allow coupling of the cache latch 407 to the switch 411 if the Z decoder 409 and R decoder 410 are set to allow coupling, i.e., their address values match their respective portions of the column address. In this manner, for selected columns, compare circuit 421 receives the sensed data value at a first input and the expected data value at a second input. The compare circuit 421 then provides a signal at its output 460 having a first logic level if both the sensed data value and the expected data value are the same and having a second logic level if the sensed data value and the expected data value have complementary logic levels. Note that if the column is not selected by higher levels of decoding, one input of the compare circuit 421 could be floating. For one embodiment, the compare circuits 421 do not indicate a mismatch if one input is floating, i.e., they provide the first logic level. For a further embodiment, they present a high impedance if one input is floating. This process can be repeated for each address value of the R decoder, e.g., 8 cycles if the R decoder is responsive to 3 bits of the column address.

If the compare circuit 421 indicates a mismatch between the sensed and expected data values, the column corresponding to that column address, i.e., the address represented by the address values of the Y decoder 408, Z decoder 409 and R decoder 410, is deemed to be defective and the address value of the R decoder 410 is further stored for use in redundancy selection. With the address values for each level of decoding identified in relation to the defective column, the stored address may be used by redundancy selection circuitry, which is generally part of the control circuitry of the memory device, to apply a repair solution to the defective columns. Redundancy selection is well understood in the art and need not be detailed herein. However, in general, known defective addresses are stored in a register. When a target address is received by the memory device, it is compared to the known defective addresses. If a match occurs, the access request for the defective portion of the memory device is routed to a redundant portion of the memory device in a manner that is transparent to the external device. In this manner, certain levels of defects can be tolerated, provided there are sufficient redundant elements to replace the defective elements.

Figure 6:
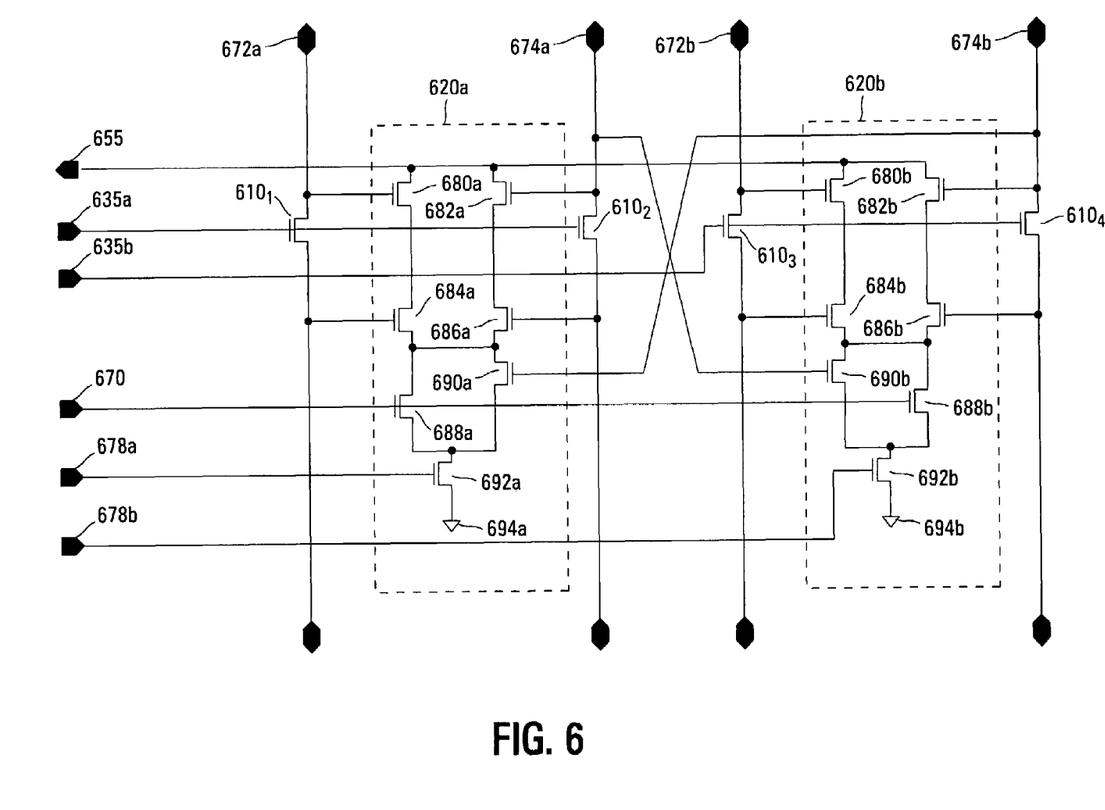
FIG. 6 is a schematic of compare circuits in accordance with one embodiment of the invention.

FIG. 6 is a schematic of compare circuits 620a and 620b in accordance with one embodiment of the invention. The compare circuits 620a or 620b could be used, for example, as compare circuits 419, 420, 421 and 520 in cases where the data path has complementary legs. Other forms of combinatorial logic capable of generating a signal indicative of a mismatch may also be used with various embodiments of the invention.

Often, columns of a memory array are paired, either physically or logically, such that when one is selected for sensing, the other is not. FIG. 6 not only provides detail of one implementation of the compare circuitry, but also demonstrates how the data path of one of the paired columns can be used to selectively disable the compare circuitry of the other column. Disabling is useful if the other column is a known bad column prior to testing as it may be desirable to avoid comparing data for a known bad column.

The compare circuit 620a is coupled to a first data path including a first leg 672a for a data value and a second leg 674a for the complement of the data value. The compare circuit 620a includes a first nFET 680a having a drain coupled to the output node 655 and a gate coupled to a first source/drain region of nFET $610_1$ in path 672a, and a second nFET 682a having a drain coupled to the output node 655 and a gate coupled to a first source/drain region of NFET $610_2$ in path 674a. The compare circuit 620a further includes a third nFET 684a having a drain coupled to a source of nFET 680a and a gate coupled to a second source/drain region of nFET $610_1$ in path 672a, and a fourth nFET 686a having a drain coupled to a source of nFET 682a and a gate coupled to a second source/drain region of nFET $610_2$ in path 674a.

The compare circuit 620a further includes an optional fifth nFET 688a having a drain coupled to the sources of nFETs 684a and 686a and a gate coupled to receive a control signal at node 670, and an optional sixth nFET 690a having a drain coupled to the sources of nFETs 684a and 686a and a gate coupled to the path 674b. In this configuration, the nFET 690a can act as a local enable device, with nFET 688a permitting an override of any deactivation of nFET 690a. To locally disable the compare circuit 620a, the data/cache latch associated with path 674b could be loaded with a data value to deactivate nFET 690a. Thus, for example, if path 674a was associated with a known bad column, the data/cache latch associated with path 674b would be loaded with a data value necessary to place path 674b in a logic low state, thus deactivating nFET 690a. In this case, assuming nFET 688a is deactivated, the compare circuit 620a would be disabled. Otherwise, the data/cache latch associated with path 674b would be loaded with a data value necessary to place path 674b in a logic high state, thus activating nFET 690a. By activating nFET 688a, however, the compare circuit 620a is locally enabled regardless of a state of nFET 690a.

The compare circuit 620a further includes an optional seventh nFET 692a having a drain coupled to the sources of nFETs 688a and 690a, a source coupled to receive a ground potential at node 694a, and a gate coupled to receive a control signal at node 678a. The nFET 692a can act as a global enable device.

The compare circuit 620b is coupled to a second data path including a first leg 672b for a data value and a second leg 674b for the complement of the data value. The compare circuit 620b includes a first nFET 680b having a drain coupled to the output node 655 and a gate coupled to a first source/drain region of nFET $610_3$ in path 672b, and a second nFET 682b having a drain coupled to the output node 655 and a gate coupled to a first source/drain region of nFET $610_4$ in path 674b. The compare circuit 620b further includes a third NFET 684b having a drain coupled to a source of nFET 680b and a gate coupled to a second source/drain region of NFET $610_3$ in path 672b, and a fourth nFET 686b having a drain coupled to a source of nFET 682b and a gate coupled to a second source/drain region of nFET $610_4$ in path 674b.

The compare circuit 620b further includes an optional fifth nFET 688b having a drain coupled to the sources of nFETs 684b and 686b and a gate coupled to receive a control signal at node 670, and an optional sixth nFET 690b having a drain coupled to the sources of nFETs 684b and 686b and a gate coupled to the path 674a. In this configuration, the nFET 690b can act as a local enable device, with nFET 688b permitting an override of any deactivation of nFET 690b. To locally disable the compare circuit 620b, the data/cache latch associated with path 674a could be loaded with a data value to deactivate nFET 690b. Thus, for example, if path 674b was associated with a known bad column, the data/cache latch associated with path 674a would be loaded with a data value necessary to place path 674a in a logic low state, thus deactivating nFET 690b. In this case, assuming nFET 688b is deactivated, the compare circuit 620b would be disabled. Otherwise, the data/cache latch associated with path 674a would be loaded with a data value necessary to place path 674a in a logic high state, thus activating nFET 690b. By activating nFET 688b, however, the compare circuit 620b is locally enabled regardless of a state of nFET 690b.

The compare circuit 620b further includes an optional seventh nFET 692b having a drain coupled to the sources of nFETs 688b and 690b, a source coupled to receive a ground potential at node 694b, and a gate coupled to receive a control signal at node 678b. The nFET 692b can act as a global enable device. It is noted that while nFET devices were used in this embodiment, other switch types, such as p-channel field effect transistors (pFETs) could be used with appropriate changes in logic levels. Also, for the embodiment depicted in FIG. 6, logic levels placed on the data path by the data/cache latch and the output latch are presumed to be complementary, such that the output of the compare circuits 620 indicate a mismatch of data values only if the logic levels on each side of the switches 610 are the same. If the data values placed on the data path by the data/cache latch and the output latch are not complementary, appropriate output of the compare circuits 620 could be achieved by replacing nFETs 684 and 686 with pFET devices.

As can be seen in FIG. 6, a mismatch of data values would be indicated by node 655 being pulled to the ground potential, e.g., a logic low. If no mismatch occurred, the output of node 655 would be a high impedance state. If a logic high signal is desired for indicating all good columns, the node 655 could be pulled up to the logic high level, e.g., Vcc, provided that the pull-up device would be overcome if at least one of the compare circuits 620 indicated a mismatch.

Figure 7:
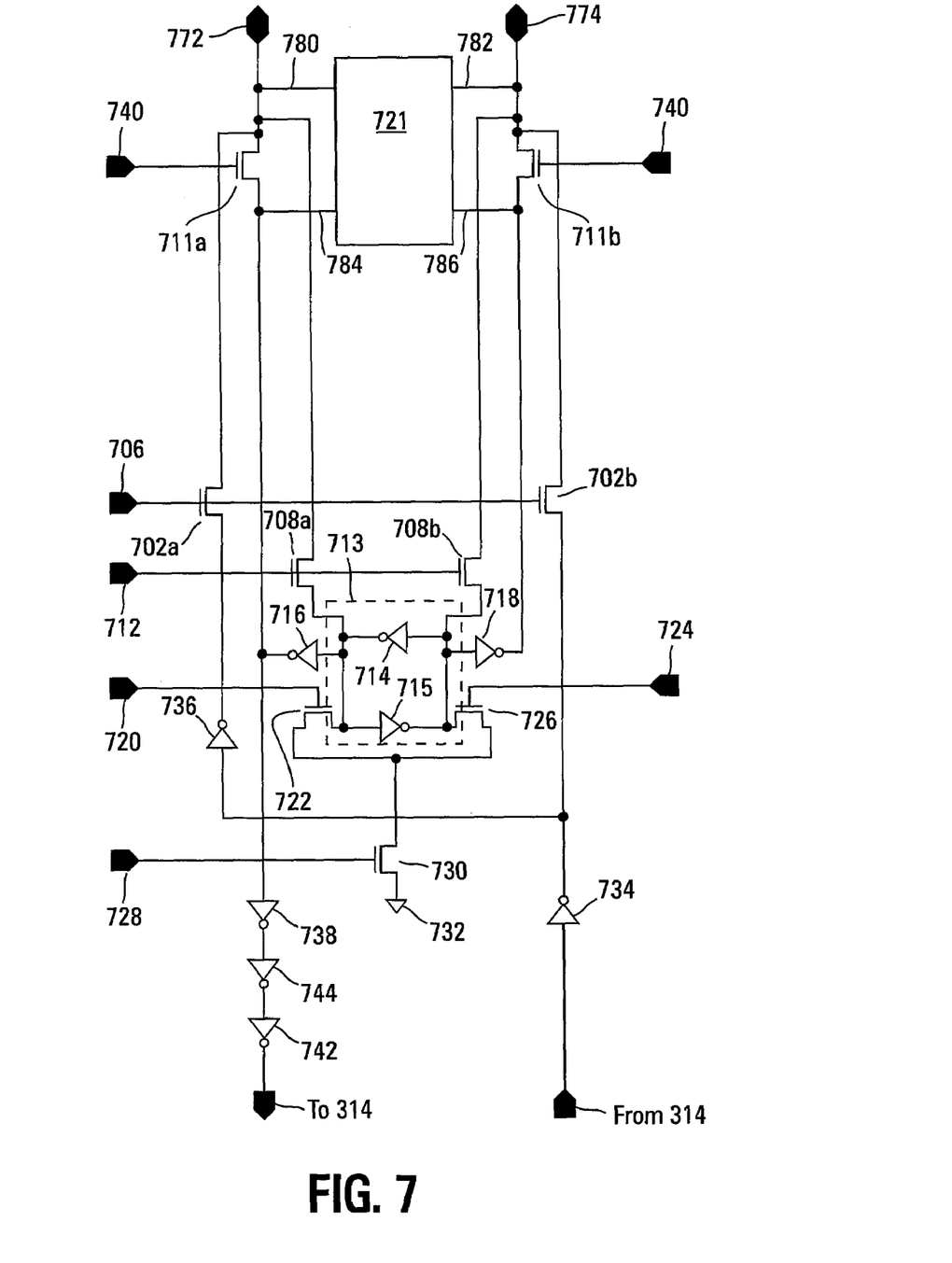
FIG. 7 is a schematic of a portion of the data path showing the relationship between a final compare circuit and an output latch in accordance with one embodiment of the invention.

FIG. 7 is a schematic of a portion of the data path showing the relationship between a final compare circuit 721 and an output latch 713 in accordance with one embodiment of the invention. As shown in FIG. 7, the compare circuit 721 has inputs coupled to legs 772 and 774 of a data path, with the inputs 780 and 784 on leg 772 coupled on opposing sides of nFET 711a, and with the inputs 782 and 786 on leg 774 coupled on opposing sides of nFET 711b. nFETs 711a and 711b each receive a control signal 740 for selectively isolating the inputs 780/784 and 782/786, respectively. Operation of the compare circuit 721 may occur substantially as described with reference to FIG. 6. However, details of the compare circuit 721 are left out to focus on the relationship with the output latch 713.

For a normal read operation, compare circuit 721 would be disabled and nFETs 711a/711b would be deactivated in response to control signal 740. In addition, nFETs 708a/708b would be activated in response to control signal 712 while nFETs 702a/702b, 722, 726 and 730 would be deactivated in response to control signals 706, 720, 724 and 728, respectively. In this manner, the data value and its complement on legs 772/774 would latch into the cross-coupled inverters 714/715 of output latch 713. The data value in output latch 713 is then available for output to I/O node 314. The data value may be buffered by one or more inverters 716, 738, 744 and 742.

For a normal write operation, compare circuit 721 would be disabled and nFETs 711a/711b would be deactivated in response to control signal 740. In addition, nFETs 702a/702b would be activated in response to control signal 706 while nFETs 708a/708b, 722, 726 and 730 would be deactivated in response to control signals 712, 720, 724 and 728, respectively. In this manner, the data value from I/O node 314 and its complement are placed on legs 772 and 774, respectively, for latching into the data/cache latches (not shown in FIG. 7).

To load the output latch 713 with a data value for comparison in accordance with embodiments of the invention, compare circuit 721 would be disabled and nFETs 711a/711b would be deactivated in response to control signal 740. In addition, nFETs 702a/702b and 708a/708b would be activated in response to control signals 706 and 712, respectively, while nFETs 722, 726 and 730 would be deactivated in response to control signals 720, 724 and 728, respectively. It would also be preferable that the legs 772 and 774 be isolated from the data/cache latches (not shown in FIG. 7), such as by deactivating one or more of the upstream decoder circuits (not shown in FIG. 7). In this manner, the data value is latched into the output latch 713.

Note that in the embodiment depicted in FIG. 7, if a logic high data value is sensed and placed on leg 772, it would be provided to the I/O node 314 as a logic high value. However, if a logic high value is received from the I/O node 314 for latching in the output latch 713, it will produce a logic low value at the output of the inverter 716. Thus, during comparison of a sensed data value and its expected data value, the inputs 780 and 786 will see a first logic level and the inputs 784 and 782 will see a second logic level if the sensed and expected data values match. Accordingly, the logic of the compare circuit 721 would need to compensate for the differing logic levels presented to the inputs of the compare circuit 721 for each leg 772/774 as described with reference to FIG. 6.

During a comparison of the data value in the output latch 713 to a sensed data value, compare circuit 721 would be enabled and nFETs 711a/711b would be deactivated in response to control signal 740. In addition, nFETs 702a/702b, 708a/708b, 722, 726 and 730 would be deactivated in response to control signals 706, 712, 720, 724 and 728, respectively. It is noted that inverter 716, which drives the input 784 of the compare circuit 721, is a normal part of the read path. However, inverter 718, which is coupled to the opposite side of the output latch 713 and drives the input 786 of the compare circuit 721, is not required for normal operation of a memory device as only one side of the output latch 713 need be driven during a read operation and the output latch 713 is typically not used for a write operation. This inverter 718 is added to buffer the signal to the input 786 as the cross-coupled inverters 714/715 of the output latch 713 are typically weak devices.

The nFETs 722, 726 and 730 are optionally provided in order to set or reset the output latch 713 without need to drive a data value from the I/O node 314. For example, there would be no need to accept an external data value if it were desired to set all output latches 713 to the same data value. To set the output latch 713 to a first data value, the nFETs 722 and 730 would be activated and the nFET 726 would be deactivated, thus pulling a first side of the output latch 713 to the ground potential node 732. To set the output latch 713 to a second data value, the nFETs 726 and 730 would be activated and the nFET 722 would be deactivated, thus pulling a second side of the output latch 713 to the ground potential node 732.

CONCLUSION

Compare logic and methods have been described for use in memory devices. The circuits and methods allow a normal mode of operation and a test mode of operation are useful in quality programs that can be performed without the need for specialized external testing equipment. The test mode of operation includes a data comparison test mode. The data comparison test mode systematically searches for addresses of defective columns by comparing a sensed data value to an expected data value at various levels of decoding. Upon detection of a defective column, the address value for each level of decoding is stored and can be used in redundancy selection to replace the defective columns with redundant columns. The comparison is internal to the memory device such that the test mode can be run after fabrication, even by an end user, thus allowing repair after fabrication and installation. The comparisons are facilitated by compare logic inserted into the data path.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of testing a memory device, comprising:
   loading data values into an array of memory cells of the memory device, the array arranged in rows and columns;
   reading data values for a plurality of columns of the array;
   loading data values into a plurality of output latches from a source other than the array, the data values loaded into the plurality of output latches corresponding to expected data values for the plurality of columns; and
   comparing the data values read from the array with their expected data values, wherein the comparison is performed in the data path between the array and the output latches;
   wherein comparing a given data value read from the array with its expected data value comprises receiving the given data value read from the array at a first input coupled to a first location of the data path and receiving its expected data value at a second input coupled to a second location of the data path; and
   wherein the first location of the data path and the second location of the data path are selectively coupled to one another such that data signals may pass from the first location to the second location during a read operation of the memory device.

2. The method of claim 1, wherein loading data values into the plurality of output latches occurs prior to reading data values for the plurality of columns of the array.

3. The method of claim 2, wherein loading data values into the plurality of output latches further comprises loading data values into the plurality of output latches from an external device.

4. The method of claim 2, wherein loading data values into the plurality of output latches further comprises loading each of the plurality of output latches with the same data value without the need for an external device.

5. The method of claim 1, wherein reading data values for the plurality of columns of the array further comprises:
selectively coupling the plurality of columns to a plurality of sensing devices;
sensing a data value for each of the columns; and
latching each of the sensed data values.

6. The method of claim 5, wherein comparing the data values read from the array with their expected data values further comprises comparing logic levels of the sensed and latched data values with logic levels of the data values loaded in their corresponding output latches.

7. The method of claim 6, wherein a mismatch between a sensed and latched data value and a data value loaded in its corresponding output latch is indicated when a logic level of the sensed and latched data value is a binary complement of logic level of the data value loaded in its corresponding output latch.

8. A method of testing a memory device, comprising:
loading data values into an array of memory cells of the memory device, the array arranged in rows and columns;
reading data values for a plurality of columns of the array corresponding to a first level of decoding;
loading data values into a plurality output latches corresponding to expected data values for the plurality of columns;
comparing the data values for the first plurality of columns with their expected data values, wherein the comparison is performed in the data path between the array and the output latches;
if any mismatch is detected between the data values for the first plurality of columns and their expected data values, comparing data values for a first subset of the first plurality of columns with their expected data values, wherein the first subset of columns corresponds to a second level of decoding and wherein the comparison for the second level of decoding is performed in the data path between the array and the output latches at a point different from the comparison for the first level of decoding.

9. The method of claim 8, wherein the first level of decoding occurs at a point in the data path prior to reading the data values of the first plurality of columns.

10. The method of claim 8, wherein the first level of decoding includes a number of columns of the memory array corresponding to a number of sensing devices used during a read operation.

11. The method of claim 8, wherein the second level of decoding occurs at a point in the data path subsequent to reading the data values of the first plurality of columns.

12. The method of claim 8, wherein comparing data values further comprises comparing logic levels presented on the data path by the data values.

13. The method of claim 12, wherein a mismatch is indicated if the logic levels of the data values presented on the data path are the same.

14. The method of claim 8, wherein the method is repeated for each address value of the first level of decoding.

15. The method of claim 8, wherein the comparison for the second level of decoding is repeated for each address value of the second level of decoding.

16. The method of claim 8, wherein comparing the data values for the first plurality of columns with their expected data values further comprises:
isolating a first portion of the data path from a second portion of the data path; and
comparing a logic level presented on the first portion of the data path with a logic level presented on the second portion of the data path.

17. The method of claim 16, wherein each portion of the data path includes a first leg and a second leg and wherein comparing a logic level presented on the first portion of the data path with a logic level presented on the second portion of the data path further comprises comparing a logic level presented on the first leg of the first portion of the data path with a logic level presented on the first leg of the second portion of the data path and comparing a logic level presented on the second leg of the first portion of the data path with a logic level presented on the second leg of the second portion of the data path.

18. The method of claim 8, further comprising:
if any mismatch is detected between the data values for the first subset of columns and their expected data values, comparing data values for a second subset of the first subset of columns with their expected data values, wherein the second subset of columns corresponds to a third level of decoding and wherein the comparison for the third level of decoding is performed in the data path between the array and the output latches at a point different from the comparison for the first and second levels of decoding.

19. The method of claim 18, wherein the third level of decoding occurs at a point in the data path subsequent to the second level of decoding.

20. The method of claim 18, wherein the comparison for the third level of decoding is repeated for each address value of the third level of decoding.

21. The method of claim 18, wherein address values for the first, second and third levels of decoding define a single column of the memory array.

22. A method of testing a memory device, comprising:
loading a known pattern of data to an array of memory cells of the memory device;
sensing data values for a first plurality of memory cells associated with a first plurality of columns of the memory array corresponding to a first address value of a first level of decoding;
latching the sensed data values in a plurality of first latches;
latching data values in a plurality of second latches from a source other than the memory array, wherein the second latches have a one-to-one correspondence with the first latches, wherein each first and second latch is part of a data path of the memory device for providing data values from the first latch to the second latch during a normal read operation, and wherein the data value for each second latch is the expected data value for its corresponding first latch;
comparing the data value of each first latch with the data value of its corresponding second latch;
indicating a defect if any first latch contains a different data value than its corresponding second latch; and
storing the first address value in a register for use by redundancy select circuitry of the memory device if a defect is indicated.

23. The method of claim 22, further comprising:
sensing data values for a second plurality of memory cells associated with a second plurality of columns of the memory array corresponding to a second address value of the first level of decoding;
latching the sensed data values in the plurality of first latches;
comparing the data value of each first latch with the data value of its corresponding second latch;

indicating a defect if any first latch contains a different data value than its corresponding second latch; and storing the second address value in a register for use by redundancy select circuitry of the memory device if a defect is indicated.

24. The method of claim 23, further comprising repeating the sensing, latching, comparing, indicating and storing for each subsequent address value of the first level of decoding.

25. The method of claim 22, further comprising:

comparing the data value of each first latch corresponding to a first subset of the first plurality of columns with the data value of its corresponding second latch, wherein the first subset of the first plurality of columns corresponds to a first address of a second level of decoding;

indicating a defect if any first latch corresponding to the first subset of the first plurality of columns contains a different data value than its corresponding second latch; and storing the first address value of the second level of decoding in a register for use by the redundancy select circuitry of the memory device if a defect is indicated.

26. The method of claim 25, further comprising repeating the sensing, latching, comparing, indicating and storing for each subsequent address value of the second level of decoding.

27. The method of claim 25 further comprising:

comparing the data value of each first latch corresponding to a first subset of the first subset of the first plurality of columns with the data value of its corresponding second latch, wherein the first subset of the first subset of the first plurality of columns corresponds to a first address of a third level of decoding;

indicating a defect if any first latch corresponding to the first subset of the first subset of the first plurality of columns contains a different data value than its corresponding second latch; and storing the first address value of the third level of decoding in a register for use by the redundancy select circuitry of the memory device if a defect is indicated.

28. The method of claim 27 further comprising repeating the sensing, latching, comparing, indicating and storing for each subsequent address value of the third level of decoding.

29. A method of repairing a memory device, comprising:

loading data values into an array of memory cells of the memory device, the array arranged in rows and columns;

reading data values for a plurality of columns of the array;

loading data values into a plurality of output latches from a source other than the array, the data values loaded into the plurality of output latches corresponding to expected data values for the plurality of columns;

comparing the data values read from the array with their expected data values, wherein the comparison is performed at a point in the data path that is located between the array and the output latches and located between complementary legs of the data path;

indicating a defect if a mismatch is detected in comparing the data values read from the array with their expected data values;

storing column addresses corresponding to columns where a mismatch is detected; and directing access requests to the stored column addresses to redundant columns.

30. The method of claim 29, wherein the method is performed after packaging.

31. The method of claim 30, wherein the method is performed after installation of the memory device in an electronic system.

* * * * *